(12) United States Patent
Wakasono

(10) Patent No.: US 6,447,963 B2
(45) Date of Patent: *Sep. 10, 2002

(54) METHOD OF MAKING A LIGHT QUANTITY CORRECTION FILTER AND METHOD OF MANUFACTURING A COLOR CATHODE RAY TUBE USING THE LIGHT QUANTITY CORRECTION FILTER MADE BY THE METHOD

(75) Inventor: Hiromi Wakasono, Hyogo (JP)

(73) Assignee: Matsushita Electric Industrial Co., Ltd., Kadoma (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/412,770

(22) Filed: Oct. 4, 1999

Related U.S. Application Data (62) Division of application No. 09/107,004, filed on Jun. 30, 1998, now Pat. No. 6,235,165.

(30) Foreign Application Priority Data

Jul. 17, 1997 (JP) .............................. 9-192106

(51) Int. Cl.[7] ................................. H01T 9/20
(52) U.S. Cl. .......................... 430/24; 430/23; 396/546; 396/547; 204/192.28; 204/192.27; 427/69; 427/109; 427/166; 427/282
(58) Field of Search ...................... 430/29, 24; 396/546, 396/547; 429/64, 68, 69, 108, 104, 126.2, 126.5, 162, 163.1, 164, 165, 166, 282; 204/192.26, 192.27, 192.28, 298.11

(56) References Cited

U.S. PATENT DOCUMENTS

| | | | | |
|---|---|---|---|---|
| 2,384,578 A | * | 9/1945 | Turner | 359/888 |
| 3,982,252 A | * | 9/1976 | Yamazaki et al. | 396/547 |
| 4,132,470 A | * | 1/1979 | Van Heek | 396/546 |
| 4,157,215 A | * | 6/1979 | Hanak | 396/546 |
| 4,303,489 A | | 12/1981 | Morrison, Jr. | 204/298.11 |
| 4,315,960 A | | 2/1982 | Ohiji et al. | 204/298.11 |
| 4,562,093 A | | 12/1985 | Mario et al. | 204/298.11 |
| 5,380,558 A | | 1/1995 | Fujino | 204/192.26 |
| 5,405,652 A | | 4/1995 | Kashiwagi et al. | 204/298.11 |
| 6,235,165 B1 | * | 5/2001 | Wakasono | 204/192.27 |

FOREIGN PATENT DOCUMENTS

| | | | | |
|---|---|---|---|---|
| FR | 2619226 | * | 2/1989 | |
| JP | 52-56853 | * | 5/1977 | 396/546 |
| JP | 54-021255 | * | 2/1979 | |
| JP | 54-021256 | * | 2/1979 | |
| JP | 58-43853 | | 9/1983 | |
| JP | 02-172131 | * | 7/1990 | 430/24 |
| JP | 6-103895 | | 4/1994 | |

* cited by examiner

Primary Examiner—Martin Angebranndt
(74) Attorney, Agent, or Firm—Merchant & Gould P.C.

(57) ABSTRACT

A light quantity correction filter that can implement the desired transmittance distribution precisely and easily without complicating an exposure system, a method of making the light quantity correction filter, and a method of manufacturing a color cathode ray tube using the light quantity correction filter are provided. The method of making the light quantity correction filter comprises providing in an evacuated container an evaporation source, a transparent substrate on which material from the evaporation source is to be deposited to form a light quantity correction filter and an evaporation amount distribution controlling sheet that has a plurality of openings and is disposed between the evaporation source and the transparent substrate, evaporating material from the evaporation source for deposition on the transparent substrate, and controlling the amount of evaporated material deposited on the transparent substrate with the distribution controlling sheet to provide a desired transmittance distribution of evaporated material on the transparent substrate.

6 Claims, 11 Drawing Sheets

RATE OF OPENING AREA $= \dfrac{W}{P}$

Fig. 2B

RATE OF OPENING AREA $= \dfrac{W_1 \times W_2}{P_1 \times P_2}$

Fig. 2C $$\text{RATE OF OPENING AREA} = \frac{W^2 \times \pi}{4 \times P_1 \times P_2}$$

RATE OF OPENING AREA OF EVAPORATION AMOUNT
DISTRIBUTION CONTROLLING SHEET: $C_1$ (%)

L = 120 MM

TRANSMITTANCE OF FILTER CENTER $TR_0$ = 60 %
RATE OF OPENING AREA OF EVAPORATION AMOUNT
DISTRIBUTION CONTROLLING SHEET CENTER $C_0$ = 30 %

PRIOR ART

Fig. 9

PRIOR ART

METHOD OF MAKING A LIGHT QUANTITY CORRECTION FILTER AND METHOD OF MANUFACTURING A COLOR CATHODE RAY TUBE USING THE LIGHT QUANTITY CORRECTION FILTER MADE BY THE METHOD

This application is a division of Ser. No. 09/107,004, filed Jun. 30, 1998 now U.S. Pat. No. 6,235,165, issued on May 22, 2001.

FIELD OF THE INVENTION

The present invention relates to a light quantity correction filter used for manufacturing a color cathode ray tube, and more particularly to a light quantity correction filter that can implement the desired transmittance distribution precisely and easily without complicating an exposure system, and a method of making the same.

BACKGROUND OF THE INVENTION

In general, a phosphor dot layer of three colors, that is, blue, green, and red, is regularly formed on the inner surface of the front panel of a color cathode ray tube by a photographic method. A light absorption layer, which is referred to as a black matrix, is formed around the phosphor dots of three colors to improve the contrast. When forming the phosphor layer and the black matrix on the inner surface of the front panel, an exposure system for manufacturing a color cathode ray tube is used.

Figure 8:
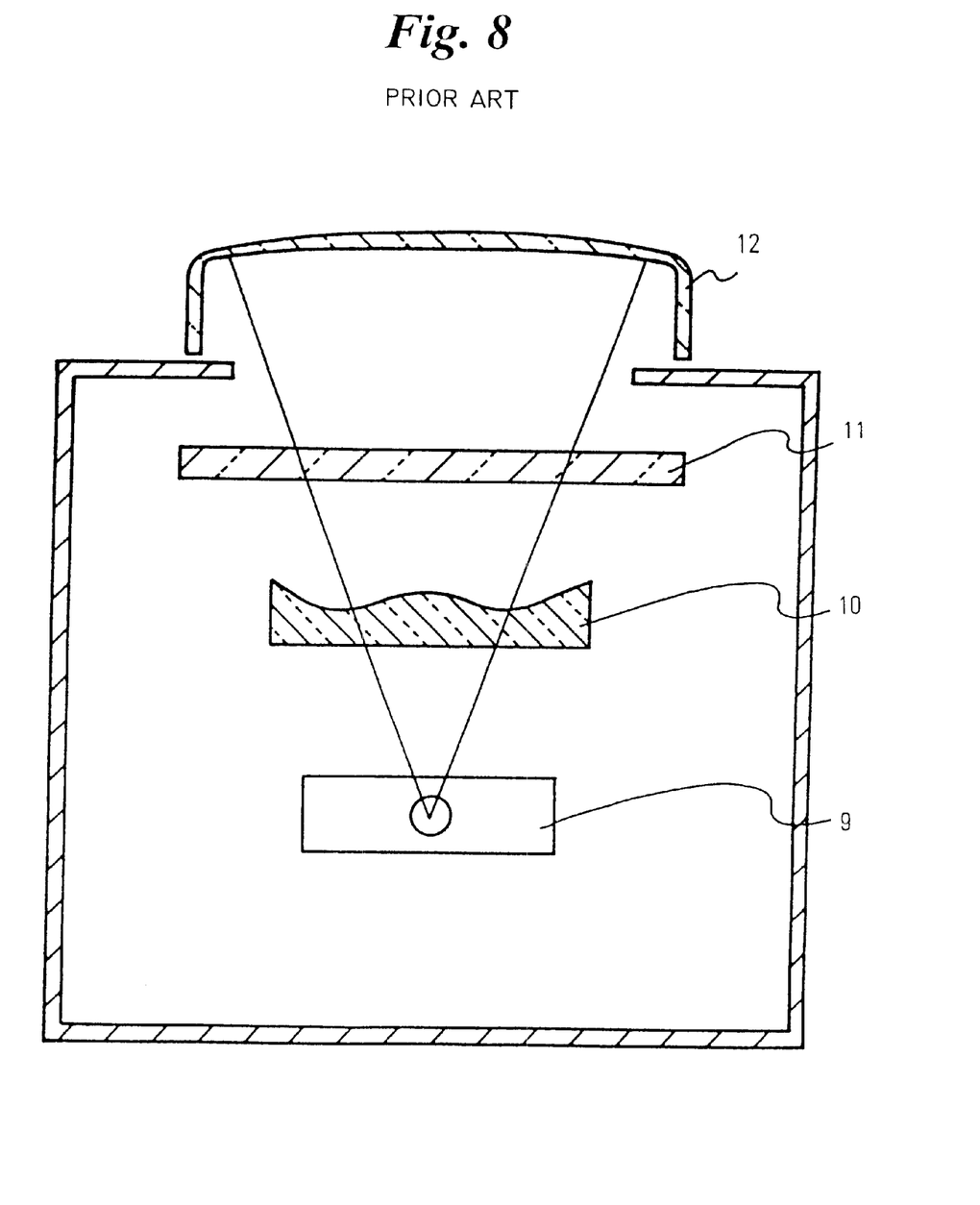
FIG. 8 is a schematic diagram of an exposure system for manufacturing a color cathode ray tube.

FIG. 8 shows a schematic diagram of an exposure system for manufacturing a color cathode ray tube. As shown in FIG. 8, the exposure system comprises a light source portion 9, a correction lens 10, and a light quantity correction filter 11. Light irradiated from the light source portion 9 passes through the correction lens 10 and the light quantity correction filter 11 and exposes a phosphor screen on the inner surface of a front panel 12. The light quantity correction filter 11 corrects the light quantity distribution of the light that passed through the correction lens 10 from the light source portion 9 to make it uniform on the inner surface of the front panel 12.

Methods for correcting the light quantity distribution of the light irradiated from the light source portion by using a light quantity correction filter having the above function include providing a predetermined light transmittance distribution by using a light quantity correction filter in which a plurality of stripe-shaped shielding portions are provided and in which the area ratio of the shielding portions to light transmission portions between the shielding portions is adjusted by the width of the shielding portions, as disclosed in Japanese Patent Application (Tokko Sho) No. 58-43853. Another method is, for example, to control the light transmittance by using a light quantity correction filter comprising an evaporated film, as disclosed in Japanese Patent Application (Tokkai Hei) No. 6-103895.

Figure 9:
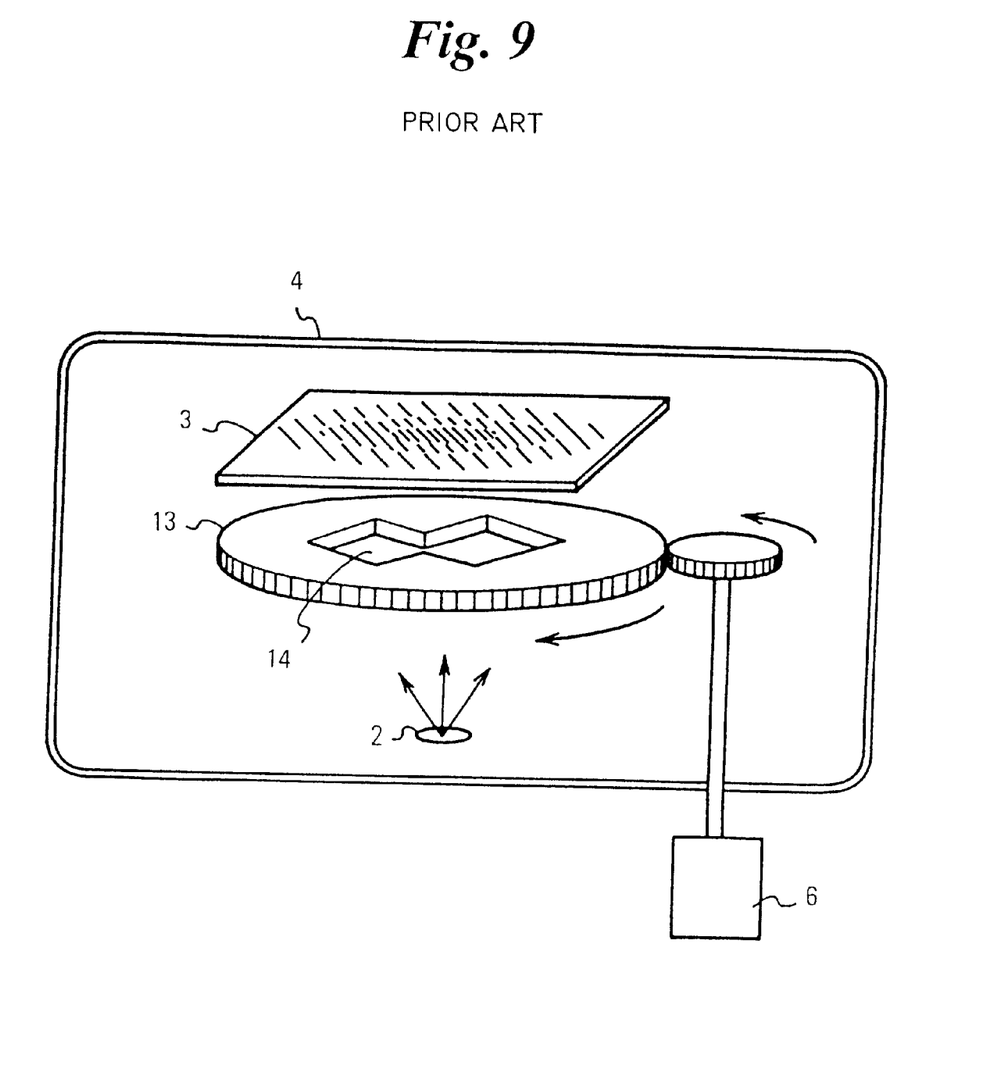
FIG. 9 is a schematic diagram of an apparatus for manufacturing a light quantity correction filter according to the prior art.

The light quantity correction filter comprising an evaporated film is manufactured, for example, by using an apparatus as shown in FIG. 9. FIG. 9 shows a schematic diagram of an apparatus for manufacturing a light quantity correction filter according to the prior art. A shielding sheet (an evaporation pattern) 13 having an opening 14 is provided between a transparent substrate 3 and an evaporation source 2. In this apparatus, the desired transmittance distribution for correction is obtained on the transparent substrate 3 by rotating the shielding sheet 13, changing the rotational speed according to the angle, and controlling the evaporation amount by the time integration ratio of the opening to the shielding portion.

Recently, in high-definition color monitor display tubes and color cathode ray tubes for high-definition televisions, reproducibility of colors and a white uniformity have been precisely required along with a large size, a wide angle deflection, and the flatness of the screen surface. Therefore, a complicated highly precise exposure correction is required during the process of forming a phosphor screen, especially the process of forming a black matrix. Accordingly, the effect of the collection and divergence of the lens becomes complicated, and a transmittance distribution for performing the corresponding complicated highly precise correction is required for a light quantity correction filter that controls the size of a back matrix.

With the correction method using the light quantity correction filter comprising a plurality of stripe-shaped shielding portions according to the prior art, however, a mechanism for oscillating the light quantity correction filter should be provided in the exposure system. Therefore, the structure of the exposure systems, a large number of which are used in the process of manufacturing color cathode ray tubes, becomes complicated. With the method of making the light quantity correction filter comprising an evaporated film according to the prior art, the evaporation amount is indirectly controlled by the time integration ratio of the opening to the shielding portion that depends on the shape of the opening, the rotational speed, and the like. Therefore, the attainable transmittance distribution is limited, and the control of the transmittance distribution is very complicated. Consequently, it is very difficult to provide the desired black matrix size distribution with a tolerance of 5% or less and obtain a sufficient white quality.

SUMMARY OF THE INVENTION

It is an object of the present invention to provide a light quantity correction filter that can implement the desired transmittance distribution precisely and easily without complicating an exposure system, a method of making the light quantity correction filter, and a method of manufacturing a color cathode ray tube using the light quantity correction filter.

In order to accomplish the above object, the present invention provides a method of making a light quantity correction filter comprising providing in an evacuated container an evaporation source, a transparent substrate on which material from the evaporation source is to be deposited to form a light quantity correction filter and an evaporation amount distribution controlling sheet that has a plurality of openings and is disposed between the evaporation source and the transparent substrate, evaporating material from the evaporation source for deposition on the transparent substrate, and controlling the amount of evaporated material deposited on the transparent substrate with the distribution controlling sheet to provide a desired transmittance distribution of evaporated material on the transparent substrate. According to the method of making a light quantity correction filter of the present invention, a light quantity correction filter having the desired transmittance distribution can be manufactured precisely and easily.

It is preferable that the openings in the distribution controlling sheet have a shape of parallel stripes. According to the preferable example, the fine nonuniformity in the transmittance distribution corresponding to the pitch of the openings in the vertical direction can be eliminated easily.

It is preferable that the controlling step comprises oscillating at least one of the evaporation source, the transparent substrate and the distribution controlling sheet with respect to the others during the evaporation step. According to the preferable example, the fine nonuniformity in the transmittance distribution corresponding to the pitch of the openings can be eliminated easily.

It is preferable that the openings in the distribution controlling sheet are formed to have a longitudinal direction component, and the direction of oscillating is substantially perpendicular to the longitudinal direction of the openings in the distribution controlling sheet. According to the preferable example, the fine nonuniformity in the transmittance distribution corresponding to the pitch of the openings can be eliminated more effectively.

It is preferable that the evaporation source is formed in a shape that is substantially linear or planar. According to the preferable example, the fine nonuniformity in the transmittance distribution corresponding to the pitch of the openings can be eliminated more effectively, and the control of the transmittance can be more simplified in forming the light quantity correction filter.

It is preferable that the evaporating step comprises sputtering. According to the preferable example, the nonuniformity of the evaporation amount among the evaporation positions is eliminated, and therefore a light quantity correction filter having the desired transmittance distribution can be manufactured precisely and easily.

The present invention provides a method of manufacturing a color cathode ray tube comprising exposing a front panel for a color cathode ray tube using a light quantity correction filter produced in accordance with the method of making a light quantity correction filter as described above and including the front panel in a construction of a color cathode ray tube. According to the method of manufacturing a color cathode ray tube of the present invention, the white quality of the color cathode ray tube can be improved effectively.

DETAILED DESCRIPTION OF THE INVENTION

Preferred embodiments of the present invention will be described below with reference to the drawings.

Figure 1:
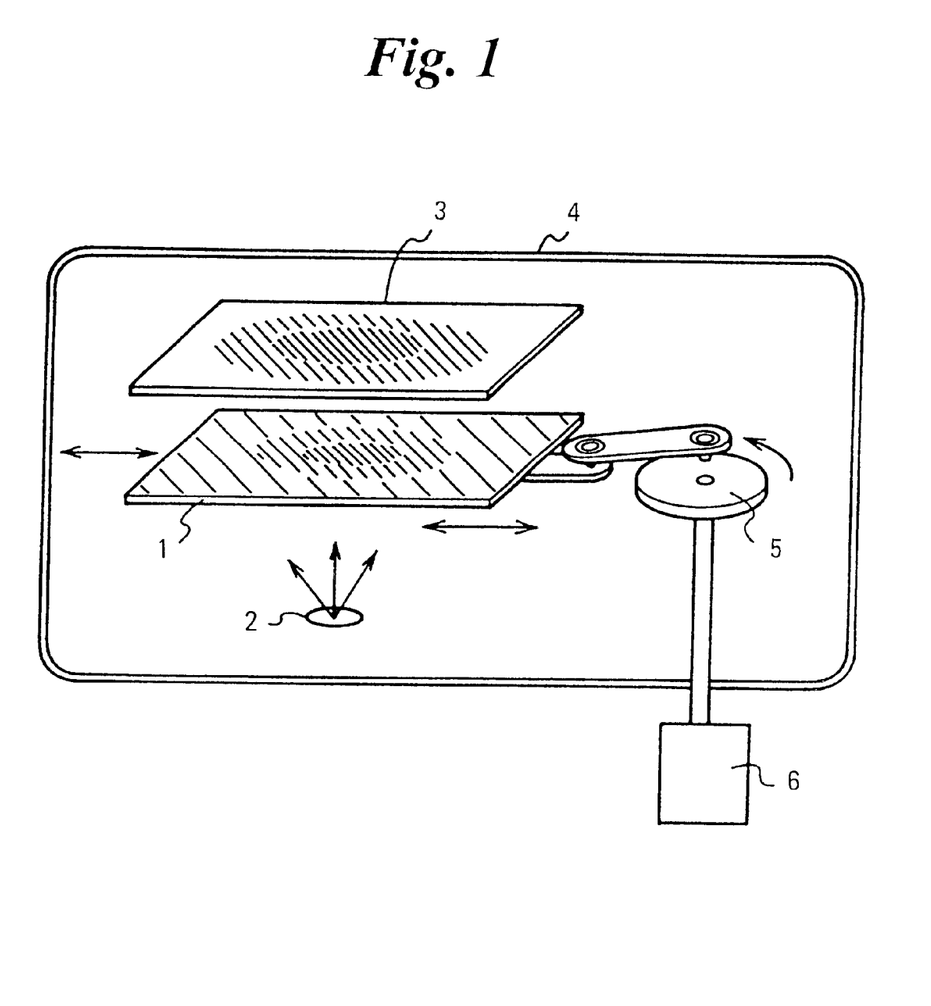
FIG. 1 is a schematic diagram of an apparatus for manufacturing a light quantity correction filter according to a first embodiment of the present invention.

FIG. 1 shows a schematic diagram of an apparatus for manufacturing a light quantity correction filter according to a first embodiment of the present invention. The apparatus for manufacturing a light quantity correction filter in this embodiment comprises an evaporation amount distribution controlling sheet 1, an evaporation source 2, and a transparent substrate 3, which are located in an evacuated bell jar 4. The evaporation amount distribution controlling sheet 1 is substantially parallel to the transparent substrate 3 and is formed of a stainless steel or the like having a plurality of holes with a pitch of 4 mm. For a rectangular sheet of stainless steel having a long side of 40 mm and a short side of 30 mm, for example, about 8 or 9 holes are formed. The evaporation source 2 comprises a substance that can form a semitransparent film, such as Inconel or chromium, placed on a heater board formed of a tungsten sheet, which is heated by charging with electricity. The transparent substrate 3 is a base material for forming a light quantity correction filter and is formed of an optical glass or the like. A light quantity correction filter is formed by evaporating the metal of the evaporation source 2 on the transparent substrate 3.

The structure of the apparatus for manufacturing a light quantity correction filter will be described below in more detail. The evaporation amount distribution controlling sheet 1 is provided between the evaporation source 2 and the transparent substrate 3. The evaporation amount distribution controlling sheet is oscillated in a direction substantially perpendicular to the longitudinal direction of the openings (the plurality of holes) by a crank 5 connected to a motor 6. The hole of the evaporation amount distribution controlling sheet 1 that is on the line between the evaporation source 2 and an arbitrary position in the transparent substrate 3 has a size required to provide the desired transmittance of the transparent substrate 3 at the position. Molecules evaporated from the evaporation source 2 reach the transparent substrate 3 through the holes of the evaporation amount distribution controlling sheet 1 and form a semitransparent film on the transparent substrate 3. As the size of the holes becomes larger, more evaporated molecules reach the transparent substrate 3, thus decreasing the transmittance of the transparent substrate 3. Therefore, the diameter of the openings of the evaporation amount distribution controlling sheet 1 is changed according to their positions as described below to control the evaporation amount for obtaining the required transmittance at the desired position in the transparent substrate 3. The transparent substrate 3 on which the semitransparent film is thus formed serves as the light quantity correction filter.

Figure 2A:
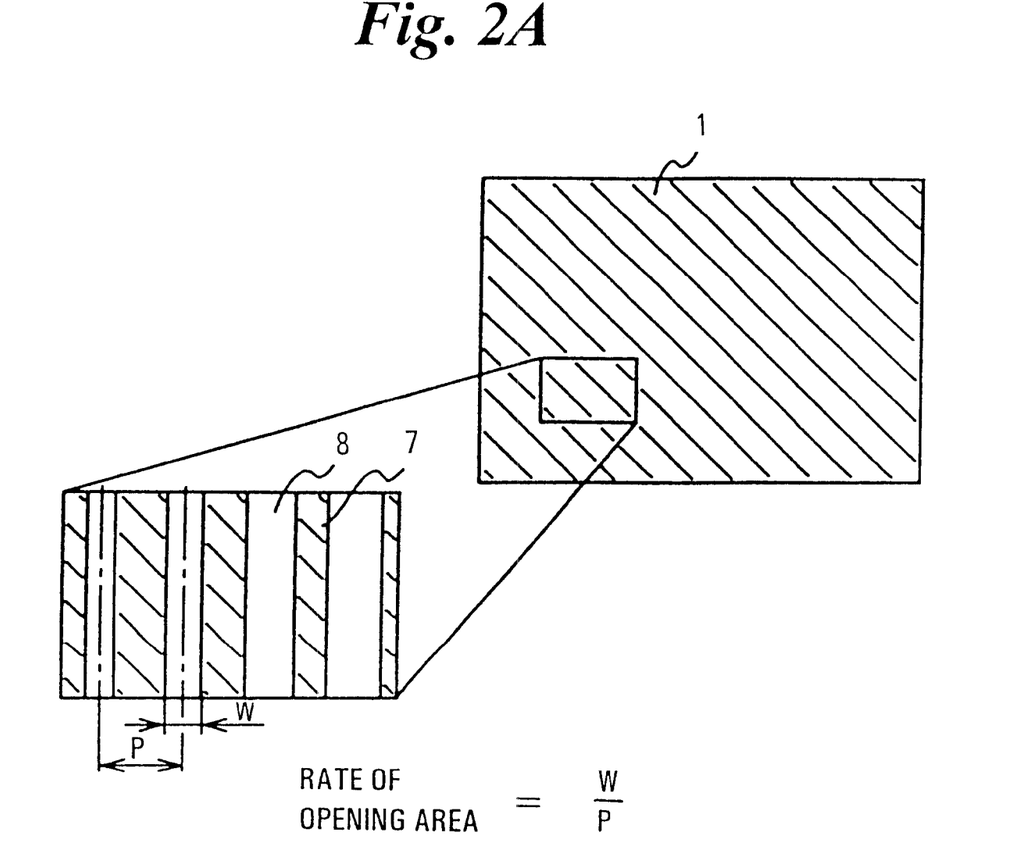
FIG. 2 is an enlarged view of the evaporation amount distribution controlling sheet of the apparatus for manufacturing a light quantity correction filter in FIG. 1.
Figure 2B:
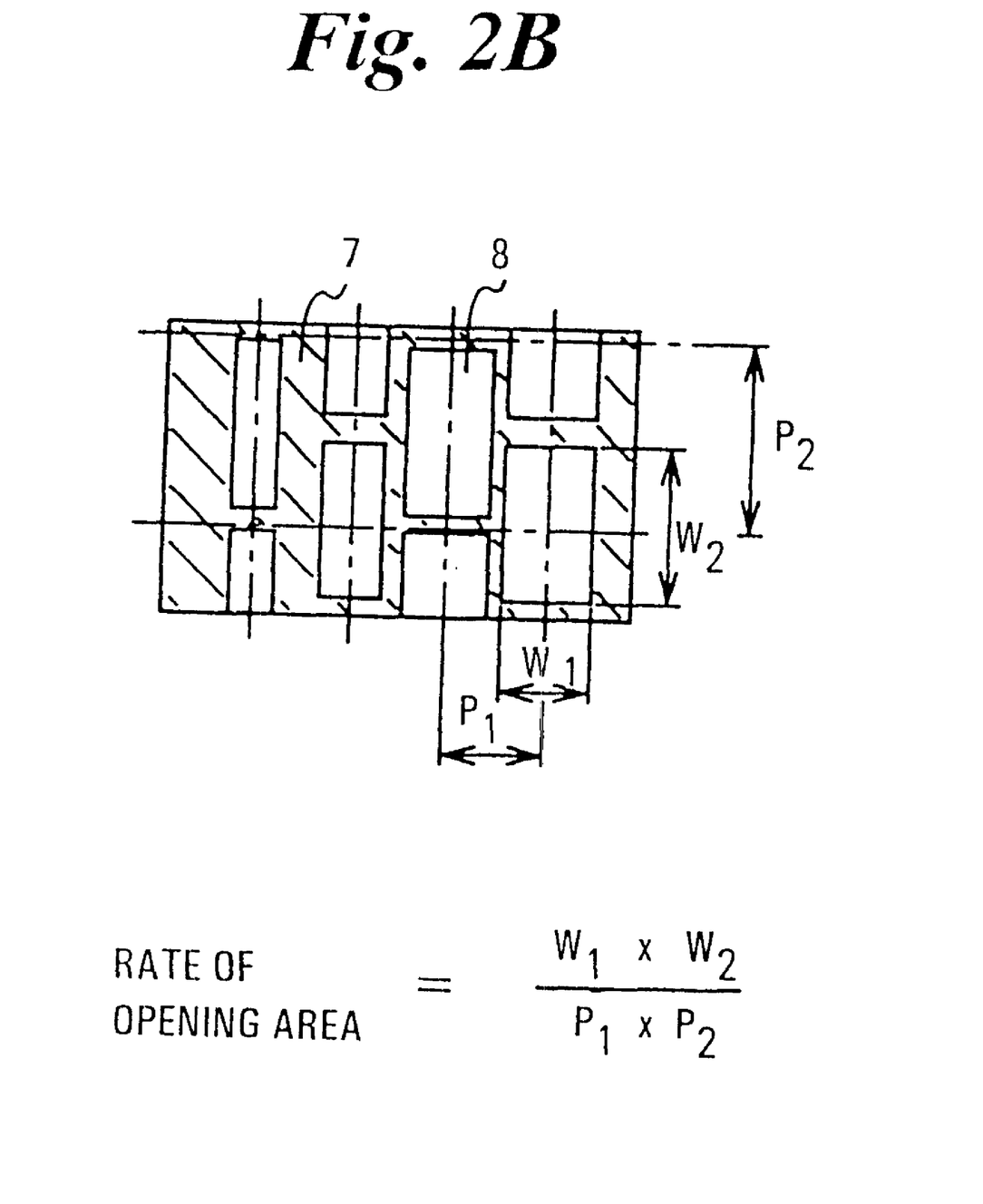
Figure 2C:
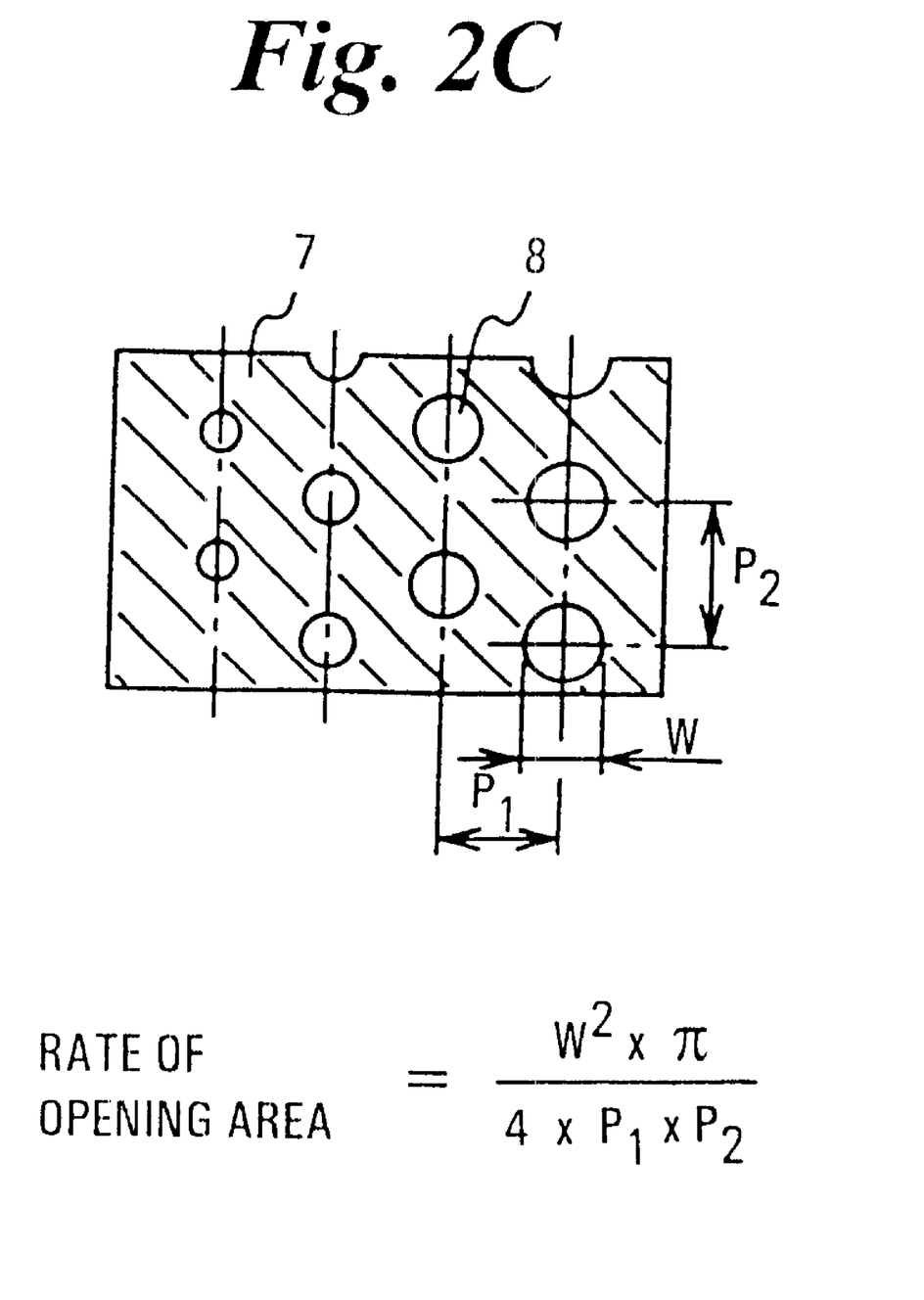

FIG. 2(a) shows an enlarged view of an evaporation amount distribution controlling sheet 1 having slit-shaped openings 8; FIG. 2(b) shows an enlarged view of an evaporation amount distribution controlling sheet 1 having rectangular openings 8; and FIG. 2(c) shows an enlarged view of an evaporation amount distribution controlling sheet 1 having circular openings 8. The shape and location pattern of the openings 8 are determined in such a manner that the degree of opening in the vertical direction in FIGS. 2(a)–(c) is greater than that in the horizontal direction in order to obtain opening distribution characteristics in which the longitudinal direction of the rectangular openings 8 and the circular openings 8 is the same as that of the slit-shaped openings 8.

In FIGS. 2(a)–(c), P and $P_1$ represent the pitch in the horizontal direction in FIGS. 2(a)–(c), $P_2$ represents the pitch in the vertical direction, and W and $W_1$ represent the width (diameter) of the openings 8. The rate of opening area is expressed by the equations shown in FIGS. 2(a)–(c). While the three types of opening shapes are illustrated in this embodiment, the present invention is not limited to these shapes. The same effects as this embodiment can be obtained with openings of other shapes, for example, a triangular shape, a square shape, a hexagonal shape, and an elliptic shape, by properly distributing the openings in the evaporation amount distribution controlling sheet 1.

When the shape of the openings 8 is a rectangle, a circle, a triangle, or the like, the evaporation amount distribution controlling sheet 1 has a higher strength than that having the slit-shaped openings 8. Therefore, such a shape is advantageous for handling the evaporation amount distribution controlling sheet 1, for example, fixing it. However, a shielding portion is present in both the vertical and horizontal directions. Therefore, it is necessary to determine the conditions for oscillating the evaporation amount distribution controlling sheet 1 in view of the shield effect of the shielding portion with respect to the amount of evaporated metal. More specifically, the oscillating should have not only the component in the direction perpendicular to the longitudinal direction of the openings (the vertical direction in FIGS. 2(a)–(c)) but also, at least, the component in the longitudinal direction.

When the shape of the openings 8 is a rectangle, a circle, a triangle, or the like, $P_1$ is about 2 to 4 mm, and $P_2$ is about 3 to 10 mm, and therefore the number of the openings 8 is about 30 to 200.

The transmittance of a correction filter is generally lower in the center of a panel where the distance between a light source and the panel is shorter, and therefore the rate of opening area of the evaporation amount distribution controlling sheet 1 should be higher in the center. Thus, as shown in FIGS. 2(a)–(c), openings closer to the center of the evaporation amount distribution controlling sheet 1 are larger in principle. However, this does not mean that the largest opening is always provided in the center or that the openings are symmetrically provided with respect to the central axis.

Figure 3:
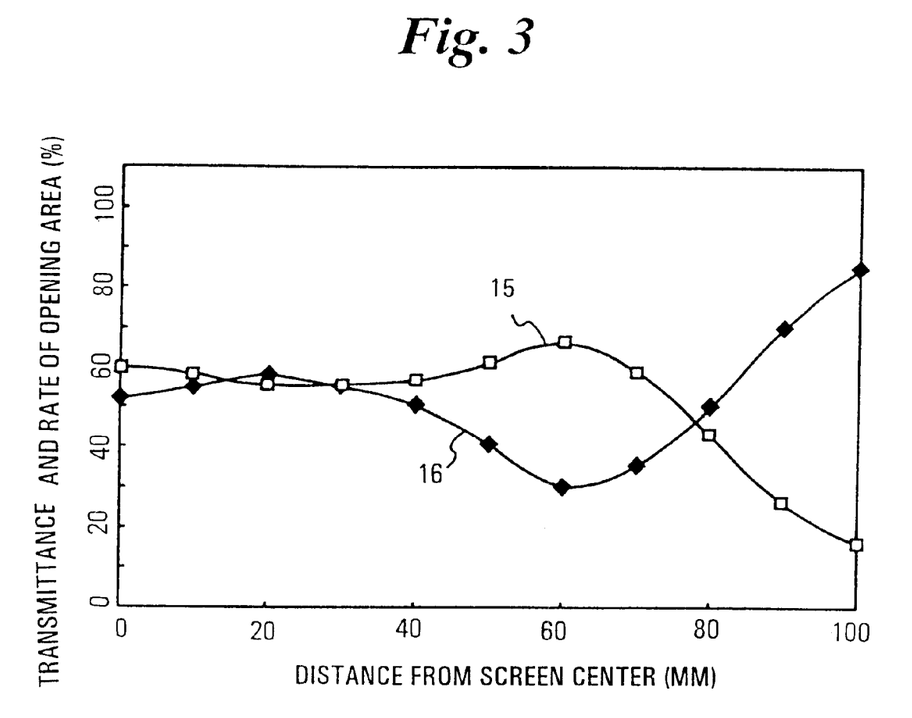
FIG. 3 is a graph showing the relationship between the distribution of the ratio of opening area of the evaporation amount distribution controlling sheet and the transmittance of the light quantity correction filter.

FIG. 3 is a graph showing the relationship between the rate of opening area of the evaporation amount distribution controlling sheet 1 and the transmittance of the light quantity correction filter. In FIG. 3, the horizontal axis represents the distance from the center of a screen, and the vertical axis represents the rate of opening area of the evaporation amount distribution controlling sheet 1 and the transmittance of the light quantity correction filter, provided that the rate of opening area of the evaporation amount distribution controlling sheet at a position is indicated at the corresponding position on the light quantity correction filter. When the desired transmittance distribution of the light quantity correction filter is a distribution 15 indicated by □ in FIG. 3, the distribution of the rate of opening area (or the area of the holes) of the evaporation amount distribution controlling sheet 1 required to obtain the desired transmittance distribution is a distribution 16 indicated by ♦. This relationship is expressed by the following equation (1) in which the transmittance Tr at an arbitrary point $F_1$ is expressed by the size of the corresponding hole of the evaporation amount distribution controlling sheet 1:

$$Tr = Tr_0 \frac{C_1}{C_0} \frac{(R_1^2 + L^2)^{\frac{3}{2}}}{L^3} \tag{1}$$

Figure 4:
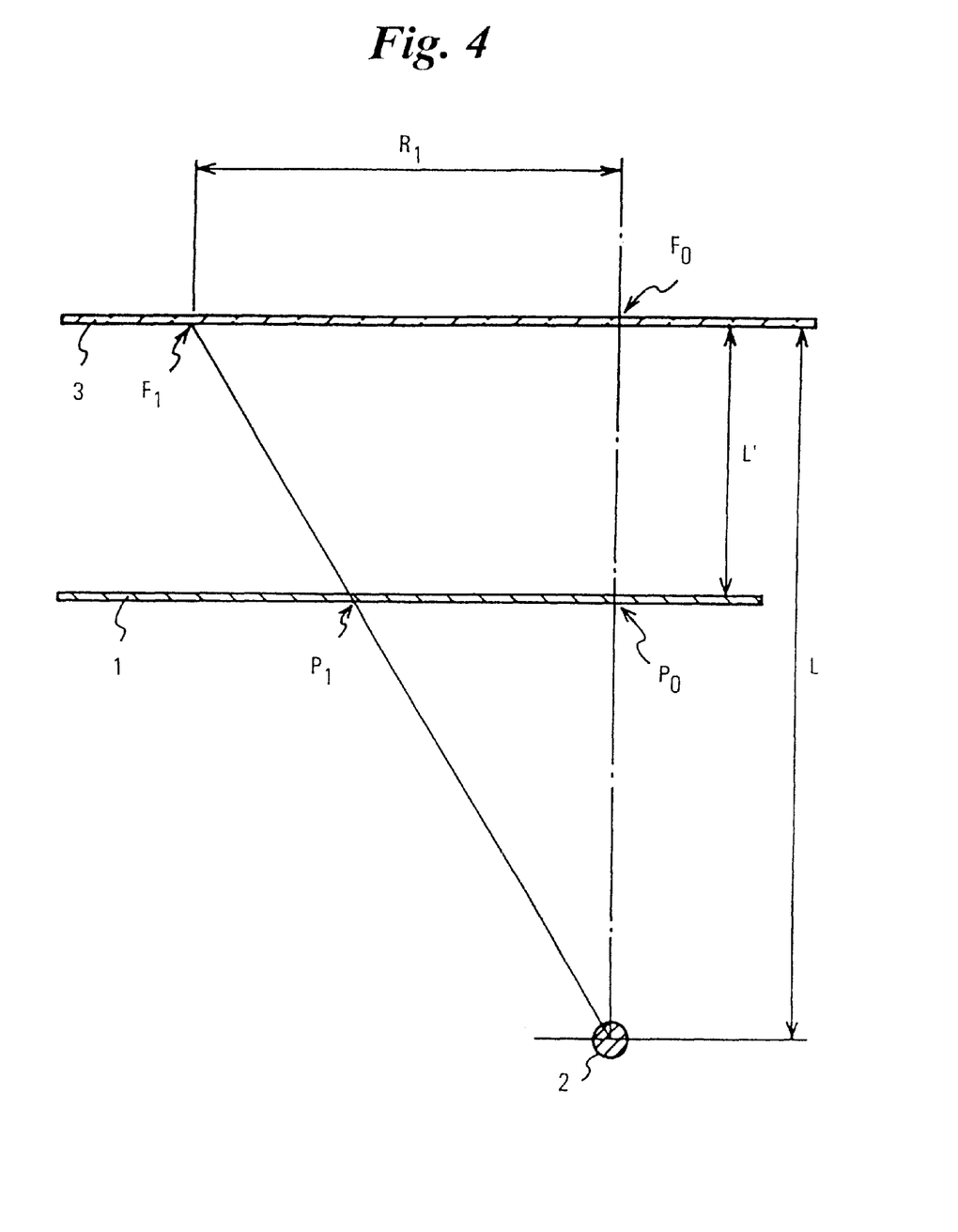
FIG. 4 shows parameters of the relative equation of the ratio of opening area of the evaporation amount distribution controlling sheet and the transmittance of the light quantity correction filter.

FIG. 4 shows the parameters of the relative equation of the rate of opening area of the evaporation amount distribution controlling sheet 1 and the transmittance of the light quantity correction filter, that is, the equation (1). In FIG. 4, the perpendicular line from the evaporation source 2 to the transparent substrate 3 is called the evaporation center line, $Tr_0$ represents the transmittance at the intersection $F_0$ of the transparent substrate 3 and the evaporation center line, $R_1$ represents the distance between the intersection $F_0$ and an arbitrary point $F_1$ on the transparent substrate 3, L represents the distance between the evaporation source 2 and the transparent substrate 3, L' represents the distance between the evaporation amount distribution controlling sheet 1 and the transparent substrate 3, $C_0$ represents the rate of opening area (or the hole area) at the intersection $P_0$ of the evaporation amount distribution controlling sheet 1 and the evaporation center line, and $C_1$ represents the rate of opening area (or the hole area) at the intersection $P_1$ of the evaporation amount distribution controlling sheet 1 and the line between the point $F_1$ on the transparent substrate 3 and the evaporation source 2.

Figure 5:
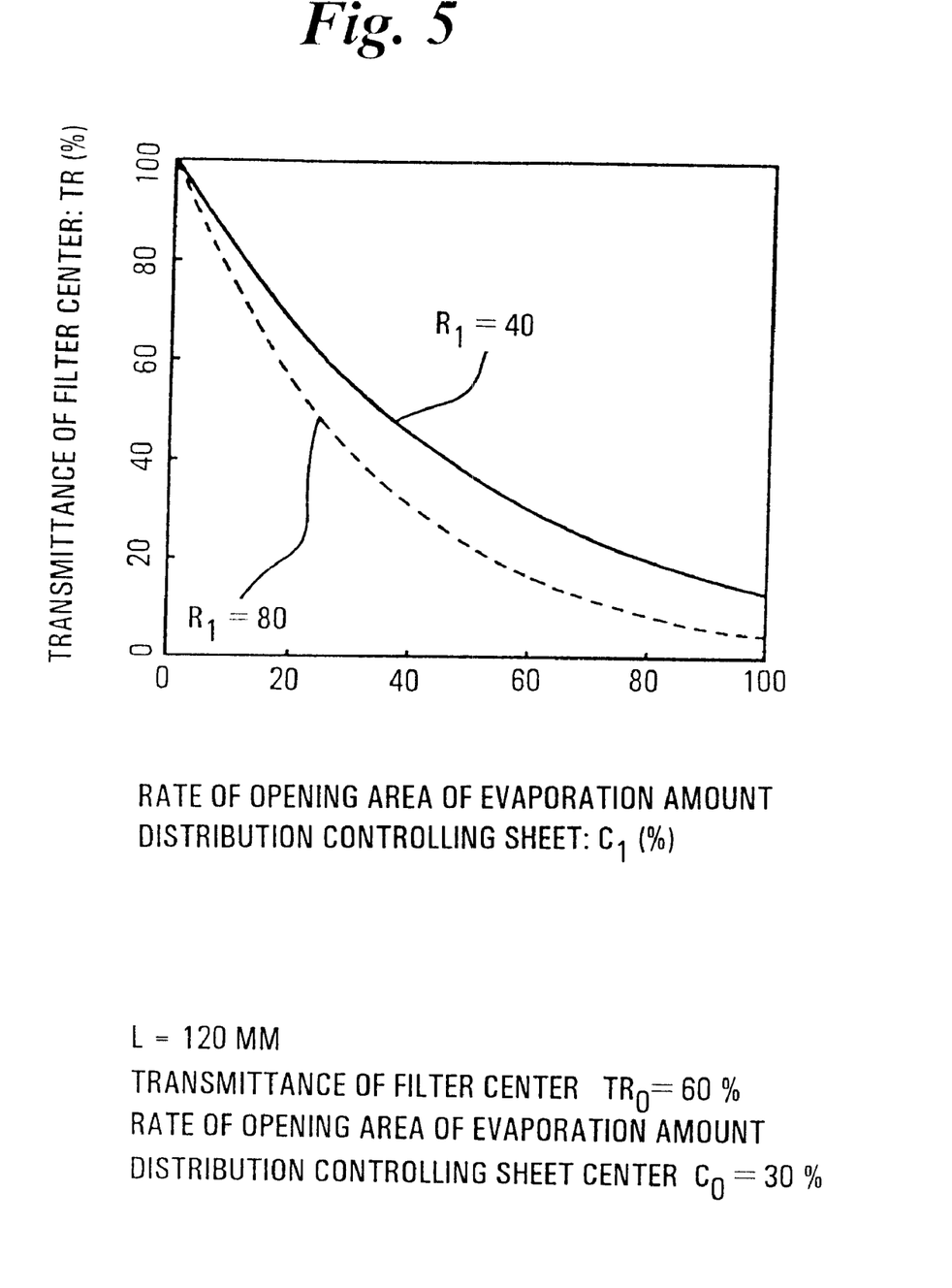
FIG. 5 is a graph showing the relationship between the ratio of opening area of the evaporation amount distribution controlling sheet and the transmittance of the light quantity correction filter.

FIG. 5 is a graph showing the relationship between the rate of opening area of the evaporation amount distribution controlling sheet 1 and the transmittance of the filter when L=120 mm, $Tr_0$=60%, and $C_0$=30%. The solid line represents the relationship when $R_1$=40 mm, and the broken line represents the relationship when $R_1$=80 mm. In FIG. 5, the horizontal axis represents the rate of opening area $C_1$ of the evaporation amount distribution controlling sheet 1, and the vertical axis represents the transmittance Tr at an arbitrary point $F_1$ on the transparent substrate 3 (the light quantity correction filter). Due to the -relationship in FIG. 5, the transmittance of the light quantity correction filter can be changed by changing the rate of opening area of the evaporation amount distribution controlling sheet 1.

Figure 6:
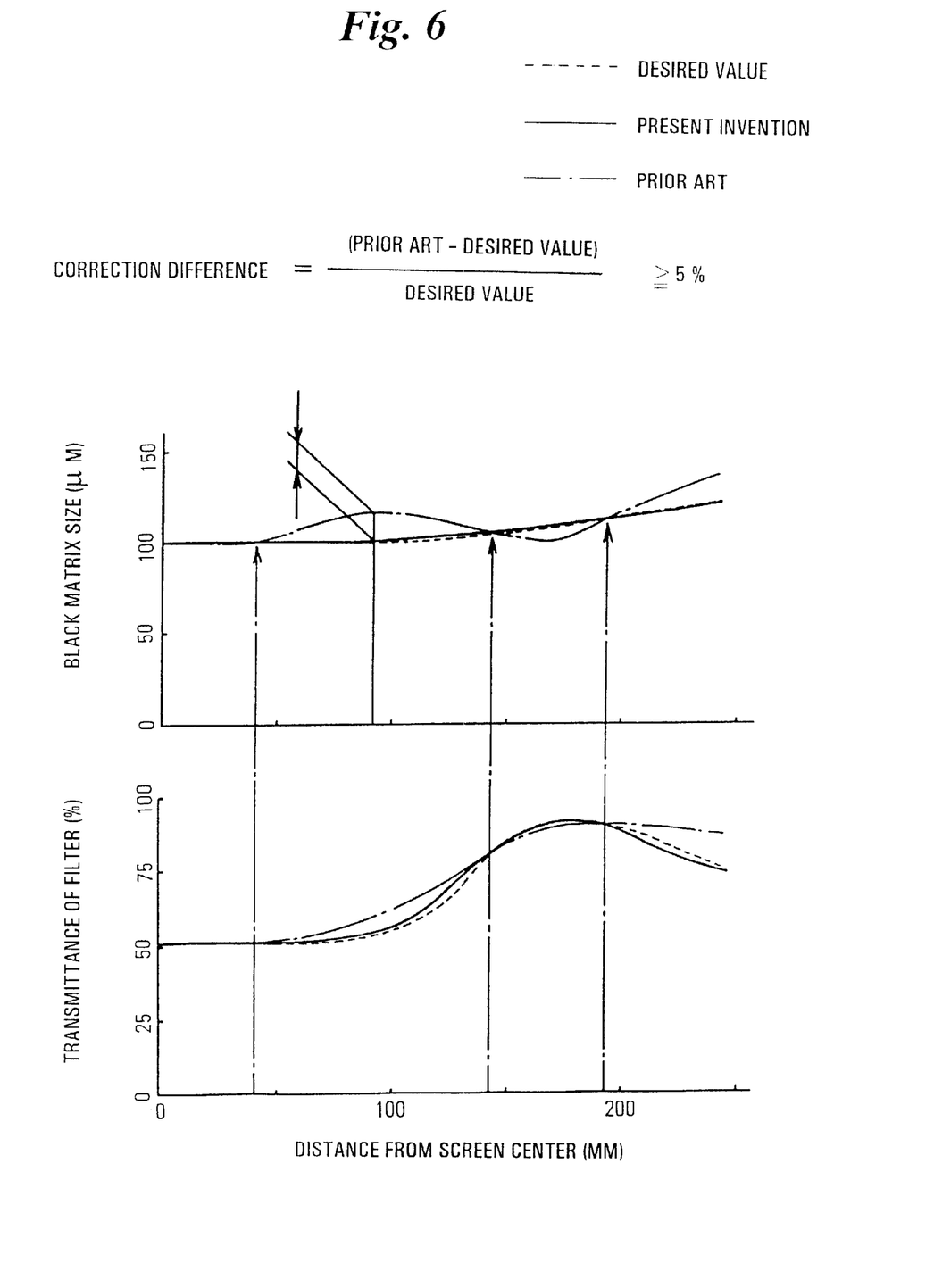
FIG. 6 is a graph showing the transmittance distribution on an arbitrary axis of the light quantity correction filter formed on the transparent substrate and the corresponding size of the black matrix on the screen surface in the first embodiment and the prior art.

FIG. 6 is a graph for comparing the prior art and this embodiment, showing the relationship between the transmittance distribution on an arbitrary axis of the light quantity correction filter formed on the transparent substrate and the corresponding size of a black matrix on a screen surface. In FIG. 6, the horizontal axis represents the distance (position) from the center of the screen, and the vertical axis represents the transmittance of the light quantity correction filter and the size of the black matrix, provided that the transmittance of the filter at a position is indicated at the corresponding position on the screen. The broken lines represent the desired values, the alternate long and short dash lines represent the values in the prior art, and the solid lines represent the values in this embodiment.

As is apparent from FIG. 6, the light quantity correction filter according to the prior art cannot be sufficiently adapted to the complicated change of the desired value of the transmittance distribution. Also, the difference between the desired value and actual value of the size of the black matrix formed by using this light quantity correction filter is not 5% or less. On the other hand, the light quantity correction filter according to this embodiment can be sufficiently adapted to the complicated change of the desired value of the transmittance distribution, and a transmittance distribution with a difference of ±5% or less with respect to the desired complicated values can be obtained. Thus, the desired value of the size of the black matrix formed by using the light quantity correction filter according to this embodiment can be substantially achieved.

In this embodiment, it is preferable to oscillate one of the evaporation amount distribution controlling sheet 1, the evaporation source 2, and the transparent substrate 3 with respect to the other two. According to the preferable example, the fine nonuniformity of the evaporation amount corresponding to the pitch of the holes (the openings 8) formed in the evaporation amount distribution controlling sheet 1 can be restrained, because the evaporation amount that is finely nonuniform due to portions through which a metal vapor passes, that is, the openings 8, and portions for shielding from the metal vapor, that is, the shielding portions 7, becomes uniform by oscillating the evaporation amount distribution controlling sheet 1. In oscillating any of the evaporation amount distribution controlling sheet 1, the evaporation source 2, and the transparent substrate 3, improved effects can be obtained by setting the oscillating width to a value equal to the pitch of the openings 8 multiplied by an integer, or by oscillating any of them at a constant speed. Furthermore, it is preferable to oscillate in a direction substantially perpendicular to the longitudinal direction of the openings 8. According to this example, the fine nonuniformity of the evaporation amount corresponding to the pitch of the openings 8 can be restrained effectively, because the oscillating direction is substantially the same as the direction in which nonuniformity occurs.

While the case where the evaporation source 2 is a dot-shaped evaporation source is described in this embodiment, the present invention is not limited to this case. The shape of the evaporation source may be a line or a plane. When the shape of the evaporation source is a plane, the control of the transmittance can be more simplified in forming a light quantity correction filter.

Figure 7:
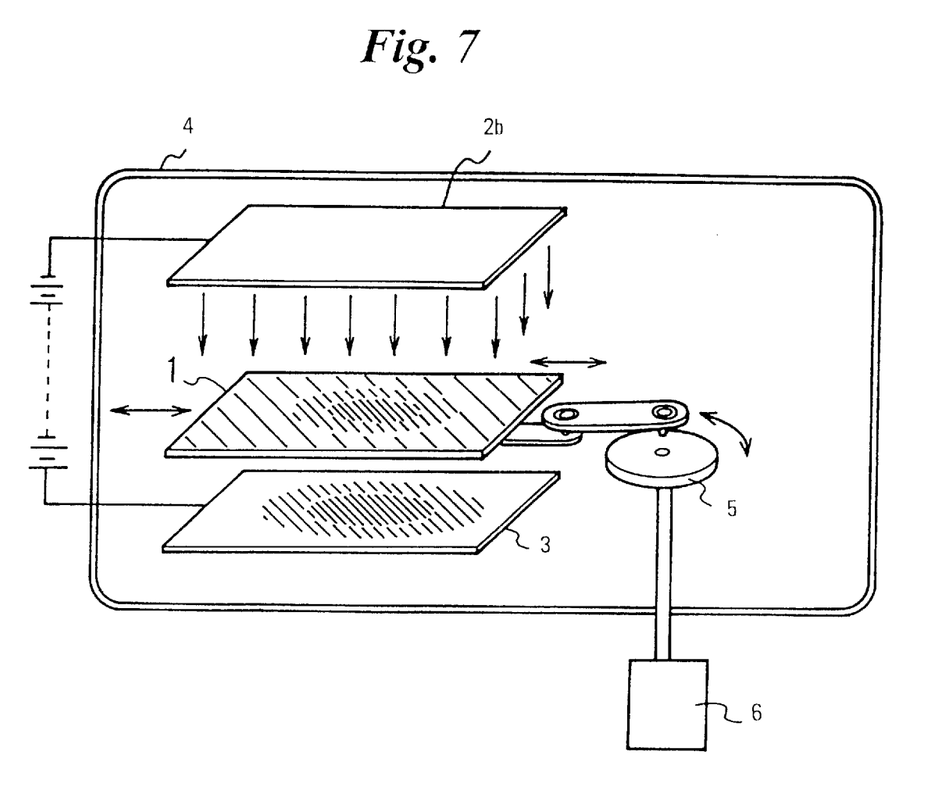
FIG. 7 is a schematic diagram of an apparatus for manufacturing a light quantity correction filter according to a second embodiment of the present invention.

FIG. 7 shows a schematic diagram of an apparatus for manufacturing a light quantity correction filter according to a second embodiment of the present invention. The apparatus for manufacturing a light quantity correction filter in this embodiment comprises an evaporation amount distribution controlling sheet 1, an evaporation source 2b such as a chromium cathode, and a transparent substrate 3, which are located in an evacuated bell jar 4. A DC power supply is connected between the evaporation source 2b and the transparent substrate 3.

In this embodiment, a high voltage is applied to the cathode and the anode (the evaporation source 2b and the transparent substrate 3) to cause a glow discharge. Due to the sputtering phenomenon involved in the discharge, a semi-transparent film is formed on the transparent substrate 3.

The difference between this embodiment and the first embodiment is that the semitransparent film is formed on the transparent substrate by vacuum evaporation in the first embodiment, while the semitransparent film is formed on the transparent substrate by sputtering in this embodiment. This embodiment and the first embodiment are basically the same with respect to other structures. In this embodiment, the evaporation amount distribution controlling sheet 1 has the same structure as the first embodiment and functions in the same manner (see FIGS. 2–6).

In the above embodiments, when $L'/L=p/s/n$ holds or $L'/L$ is sufficiently larger than $p/s$, in which s is the size of the evaporation source, p is the pitch of the openings formed in the evaporation amount distribution controlling sheet 1, and n is an integer of 1 or more, the fine nonuniformity corresponding to the pitch of the openings can be restrained more effectively.

While the case where the evaporation amount distribution controlling sheet 1 is oscillated by using the motor 6 and the crank 5 is described in the above embodiments, the present invention is not limited to this structure. The evaporation amount distribution controlling sheet 1 may be oscillated by other methods, for example, a method using a motor and a cam, a method using a stepping motor and a ball screw, and a method using a linear motor.

While the case where Inconel, chromium, or the like, is used as the substance evaporated to form a semitransparent film in the above embodiments, the present invention is not limited to these substances. Metals such as silver and rhodium and other inorganic substances can be applied in the same manner, and the same effects can be obtained.

Furthermore, according to the above embodiments, a light quantity correction filter that corrects a light quantity distribution during exposure with a more improved precision than light quantity correction filters formed according to the prior art can be obtained. Therefore, when the light quantity correction filter according to the above embodiments is used in forming an exposure device for manufacturing a color cathode ray tube that exposes a front panel for a color cathode ray tube, the white quality of the color cathode ray tube can be improved effectively. In the practical color cathode ray tube for display that is manufactured by using the light quantity correction filter, a white nonuniformity is hardly perceived. This effect is expressed by a numerical value. With a manufacturing method according to the prior art, the difference in the illumination distribution on the panel is about 5 to 15% after the correction during exposure, and a white nonuniformity can be perceived. With the manufacturing method according to the present invention, the difference in the illumination distribution is 5% or less after the correction, and therefore the white quality can be improved. This is because a black matrix size distribution with a difference of ±5% or less with respect to the desired value can be obtained as described above.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A method of manufacturing a color cathode ray tube, comprising providing in an evacuated container an evaporation source, a transparent substrate on which material from the evaporation source is to be deposited to form a light quantity correction filter having a desired smooth transmittance distribution of evaporated material and an evaporation amount distribution controlling sheet that has a plurality of openings and is disposed between the evaporation source and the transparent substrate;

evaporating material from the evaporation source for deposition on the transparent substrate; and controlling an amount of evaporated material deposited on the transparent substrate with the distribution controlling sheet wherein the transmittance distribution is determined by an arrangement of the plurality of openings such that a degree of opening in a vertical direction is greater than that in a horizontal direction and openings closer to a center of the evaporation amount distribution controlling sheet are larger;

exposing a front panel of the color cathode ray tube using the light quantity correction filter; and using the front panel in a construction of a color cathode ray tube.

2. The method of claim 1, wherein the openings in the distribution controlling sheet have a shape of parallel stripes.

3. The method of claim 1, wherein the controlling step comprises oscillating at least one of the evaporation source, the transparent substrate and the distribution controlling sheet with respect to the others during the evaporation step.

4. The method of claim 3, wherein the openings in the distribution controlling sheet are formed to have a longitudinal direction, and the direction of oscillating has a component substantially perpendicular to the longitudinal direction and a component in the longitudinal direction of the openings in the distribution controlling sheet.

5. The method of claim 1, wherein the evaporation source is formed in a shape that is substantially linear or planar.

6. The method of claim 1, wherein the evaporating step comprises sputtering.

* * * * *